(12) United States Patent
Takahashi

(10) Patent No.: US 7,948,800 B2
(45) Date of Patent: May 24, 2011

(54) SEMICONDUCTOR MEMORY DEVICE AND DRIVING METHOD FOR THE SAME

(75) Inventor: Keita Takahashi, Nara (JP)

(73) Assignee: Panasonic Corporation, Osaka (JP)

( * ) Notice: Subject to any disclaimer, the term of this patent is extended or adjusted under 35 U.S.C. 154(b) by 274 days.

(21) Appl. No.: 12/352,839

(22) Filed: Jan. 13, 2009

(65) Prior Publication Data

US 2009/0185427 A1     Jul. 23, 2009

(30) Foreign Application Priority Data

Jan. 23, 2008    (JP) .................................. 2008-013011

(51) Int. Cl.
*G11C 16/00*        (2006.01)
(52) U.S. Cl. ......... 365/185.17; 365/185.02; 365/185.05; 365/185.18
(58) Field of Classification Search .............. 365/185.02
See application file for complete search history.

(56) References Cited

U.S. PATENT DOCUMENTS

| | | | |
|---|---|---|---|
| 5,438,542 A * | 8/1995 | Atsumi et al. | 365/182 |
| 5,515,319 A * | 5/1996 | Smayling et al. | 365/185.27 |
| 6,337,502 B1 | 1/2002 | Eitan et al. | |
| 6,469,342 B1 | 10/2002 | Kuo et al. | |
| 6,628,544 B2 * | 9/2003 | Shum et al. | 365/185.03 |
| 6,869,844 B1 | 3/2005 | Liu et al. | |
| 7,196,369 B2 | 3/2007 | Chou et al. | |
| 7,755,135 B2 * | 7/2010 | Yoo et al. | 257/321 |
| 2001/0026970 A1 | 10/2001 | Eitan et al. | |

FOREIGN PATENT DOCUMENTS

JP       2001-057389       2/2001

* cited by examiner

*Primary Examiner* — Tan T. Nguyen
(74) *Attorney, Agent, or Firm* — McDermott Will & Emery LLP

(57) ABSTRACT

The semiconductor memory device includes: a first well of a first conductivity type, a second well of the first conductivity type and a third well of a second conductivity type formed in a substrate: a diffusion bit line extending in a row direction and a word line extending in a column direction both formed in the second well; a plurality of semiconductor memory elements arranged in a matrix, each connected with the diffusion bit line and the word line; a selection transistor formed in the first well for applying a voltage to the diffusion bit line; and a forward diode formed of a diffusion layer of the first conductivity type formed in the third well and the third well. The diffusion bit line, the forward diode and the source of the selection transistor are electrically connected with one another.

12 Claims, 10 Drawing Sheets

SEMICONDUCTOR MEMORY DEVICE AND DRIVING METHOD FOR THE SAME

CROSS-REFERENCE TO RELATED APPLICATIONS

This application claims priority under 35 U.S.C. §119 on Patent Application No. 2008-013011 filed in Japan on Jan. 23, 2008, the entire contents of which are hereby incorporated by reference.

BACKGROUND OF THE INVENTION

The present disclosure relates to a semiconductor memory device and a driving method for the same, and more particularly to a MONOS memory and a driving method for the same.

In recent years, with the trend toward higher integration and lower cost in non-volatile semiconductor memory devices, a local trapping MONOS (metal-oxide-nitride-oxide-silicon) memory that has a virtual ground array and traps charge locally has been proposed.

The local trapping MONOS memory however has a problem that the threshold voltage varies when charge is trapped in an ONO (oxide-nitride-oxide) film under in-process charging. It is therefore important to prevent influence of such in-process charging. Also, while emphasis has conventionally been placed on protection against in-process charging for word lines, protection against in-process charging for bit lines has become an indispensable technique as the memory size has become finer.

For example, a technique has been known in which in-process charging to bit lines can be limited to a range of about +7 V to about −1 V and in-process charging to word lines to a range of about ±1 V (see Japanese Laid-Open Patent Publication No. 2001-57389, for example).

SUMMARY OF THE INVENTION

In the conventional technique described above, however, positive charge applied to bit lines of memory cells does not escape to the ground potential of the semiconductor substrate until exceeding the breakdown voltage (about 7 V) of the memory cell diffusion layer. This may possibly affect the characteristics of the memory cells. More specifically, the threshold voltage observed immediately after termination of diffusion may rise or drop compared with that in the normal situation, and/or the reliability of the endurance characteristic and the like may degrade.

An object of the present disclosure is providing a semiconductor memory device capable of suppressing positive/negative charge applied to bit lines of memory cells during a fabrication process to about ±1 V. The semiconductor memory device of the present disclosure is provided with an element for letting positive charge applied to bit lines escape to the semiconductor substrate.

The semiconductor memory device of the present invention includes: a first well of a first conductivity type, a second well of the first conductivity type and a third well of a second conductivity type formed in a substrate: a diffusion bit line extending in a row direction and a word line extending in a column direction both formed in the second well; a plurality of semiconductor memory elements arranged in a matrix, each connected with the diffusion bit line and the word line; a first transistor formed in the first well for applying a voltage to the diffusion bit line; and a diode formed in the third well, the diode being formed of the third well and a diffusion layer of the first conductivity type formed in an upper portion of the third well, wherein the diffusion bit line, the diode and a source of the first transistor are electrically connected with one another.

In the semiconductor memory device described above, in-process positive charge is allowed to escape to the ground potential via the third well. Hence, the voltage applied to the diffusion bit line under in-process charging will not exceed the level of the threshold voltage of a transistor connected to the third well. Also, influence of in-process negative charge can be reduced as in the conventional semiconductor memory devices.

Alternatively, the semiconductor memory device of the present invention includes: a first well of a first conductivity type, a second well of the first conductivity type and a third well of the first conductivity type formed in a substrate: a diffusion bit line extending in a row direction and a word line extending in a column direction both formed in the second well; a plurality of semiconductor memory elements arranged in a matrix, each connected with the diffusion bit line and the word line; a first transistor formed in the first well for applying a voltage to the diffusion bit line; and a second transistor formed in the third well, wherein the diffusion bit line, a drain of the second transistor and a source of the first transistor are electrically connected with one another, and a source of the second transistor is connected with a ground potential.

In the case described above, in-process charge is allowed to escape to the ground potential via the second transistor. Hence, the voltage applied to the diffusion bit line under in-process charging will not exceed the level of the threshold voltage of the transistor connected to the third well. Also, influence of in-process negative charge can be reduced as in the conventional semiconductor memory devices.

DESCRIPTION OF THE PREFERRED EMBODIMENTS

Figure 1:
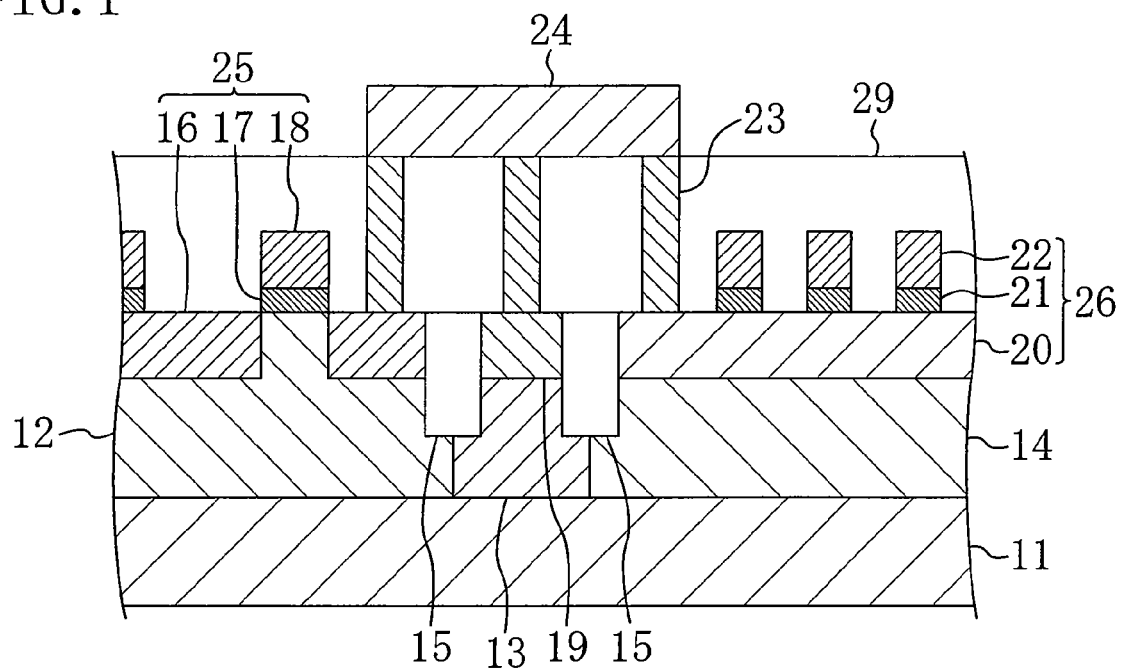
FIG. 1 is a cross-sectional view of a semiconductor memory device of an embodiment of the present invention.

FIG. 1 shows a cross-sectional structure of a semiconductor device of an embodiment of the present invention. As shown in FIG. 1, first and second p-wells 12 and 14 and an n-well 13 are formed in a semiconductor substrate 11.

In the first p-well 12, a selection transistor 25 is formed which is electrically isolated from the surroundings with an element isolation film 15. The selection transistor 25 has n-type diffusion layers 16 as its source/drain, a first gate insulating film 17 and a first gate electrode 18.

In the second p-well 14, memory cells 26 as semiconductor memory elements are formed. Each of the memory cells 26 has a bit line diffusion layer 20 as its source/drain, a second gate insulation film 21 and a second gate electrode 22.

In the n-well 13, a p-type diffusion layer 19 is formed. An end of the bit line diffusion layer 20, one of the n-type diffusion layers 16 of the selection transistor 25 and the p-type diffusion layer 19 are electrically connected with one another via contacts 23 formed through an inter-layer insulating film 29 and a first-layer metal interconnect 24.

Figure 19:
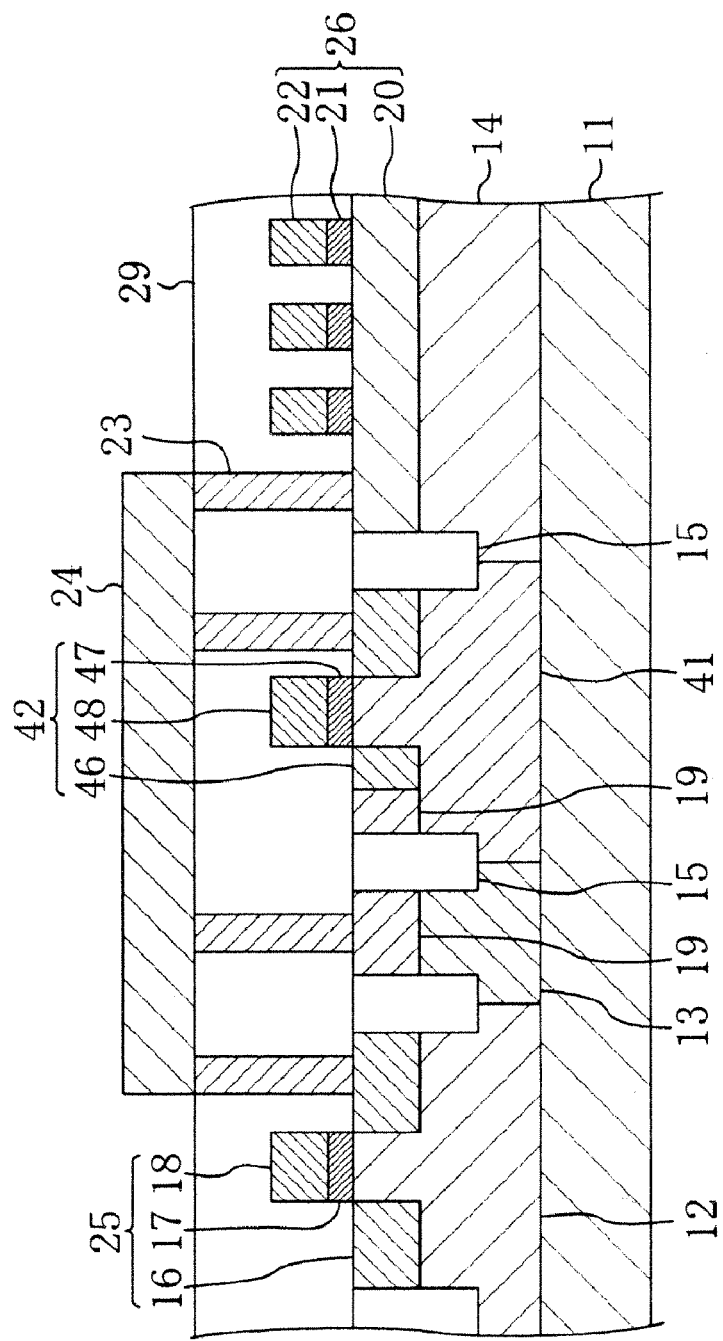
FIG. 19 is cross-sectional view of the semiconductor memory device having an antenna NMOS.

The n-well 13 is electrically connected with the drain of an antenna NMOS 42, as shown, for example, in FIG. 19, having an antenna structure for collecting positive charge by means of a metal interconnect and the like. The source of the antenna NMOS is connected with the ground potential of the semiconductor substrate 11.

Note that FIG. 1 is depicted bearing a local trapping MONOS and a virtual ground array in mind. However, this embodiment may otherwise be configured as a floating gate electrode type memory using a NOR array, or may be applicable to a memory having bit lines such as mask ROM and SRAM. Also, although expressed as the selection transistor in this description, the transistor may functionally be an output transistor such as a decoder.

In the semiconductor device of the embodiment, an end of the bit line diffusion layer 20 of the memory cells 26, one of the n-type diffusion layers 16 of the selection transistor 25 and the p-type diffusion layer 19 are electrically connected with one another via the contacts 23 and the first-layer metal interconnect 24. This connection may otherwise be made via an interconnect in a further upper layer in place of the first-layer metal interconnect 24. For the purpose of letting in-process charge in the wiring layer escape, however, it is preferred to use the first-layer metal interconnect 24. The first-layer metal interconnect refers to a metal interconnect formed in one of a plurality of wiring layers formed above the semiconductor substrate that is closest to the semiconductor substrate.

Figure 2:
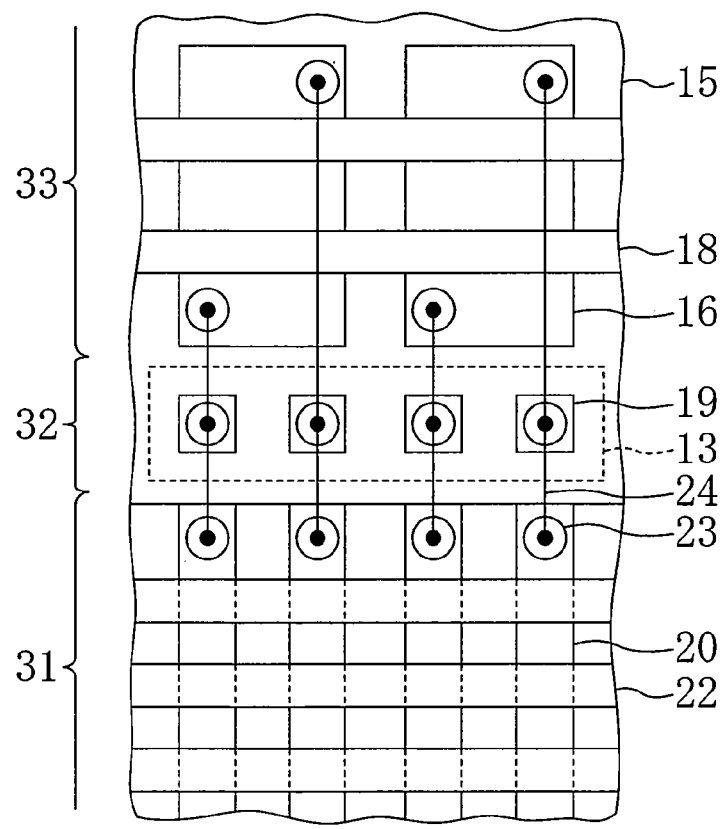
FIG. 2 is a plan view of the semiconductor memory device of the embodiment.

The plane structure of the semiconductor memory device of the embodiment will be described with reference to FIG. 2. As shown in FIG. 2, in a first region 31, in which the second p-well is formed, the second gate electrodes 22 that are to be word lines extending in the X direction and the bit line diffusion layers 20 that are to be bit lines extending in the Y direction are placed in a matrix, to thereby form a plurality of memory cells.

In a second region 32, in which the n-well is formed, a plurality of p-type diffusion layers 19 are formed, to thereby form a plurality of forward diodes.

In a third region 33, in which the first p-well is formed, the n-type diffusion layers 16 isolated from one another with the element isolation film 15 and the first gate electrodes 18 extending in the X direction are formed, to thereby form a plurality of selection transistors separated pair by pair from one another.

An end of each bit line diffusion layer 20 of the memory cells 26, each p-type diffusion layer 19 and one of the n-type diffusion layers of each selection transistor 25 are electrically connected via the contacts 23 and each first-layer metal interconnect 24.

Figure 3:
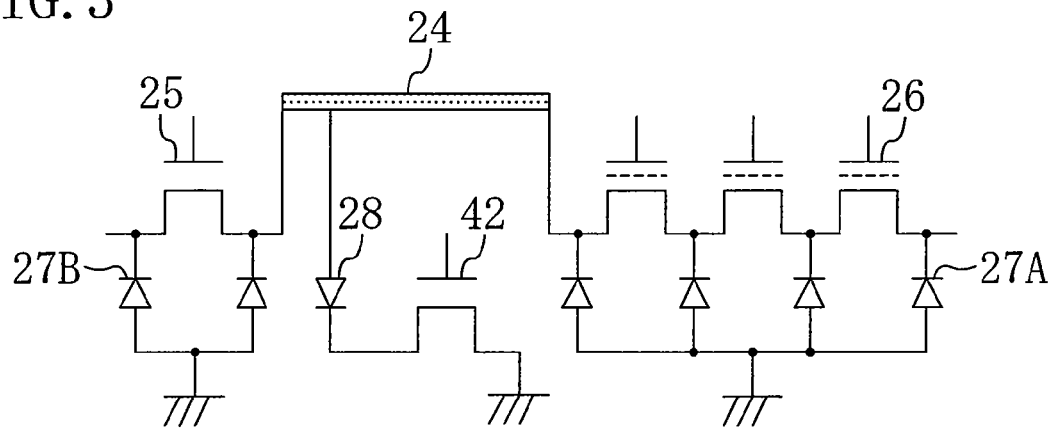
FIG. 3 is a circuit diagram showing a bit line protection circuit of the semiconductor memory device of the embodiment.

The circuit structure of the semiconductor device of the embodiment will be described with reference to FIG. 3. As shown in FIG. 3, backward diodes 27A are connected with the sources/drains of the memory cells 26. The backward diode 27A is a diode formed of the bit line diffusion layer 20 and the second p-well 14 in FIG. 1. Backward diodes 27B are connected with the source/drain of the selection transistor 25. The backward diode 27B is a diode formed of the n-type diffusion layer 16 and the first p-well 12 in FIG. 1. An end of the sources/drains (the bit line diffusion layer 20 in FIG. 1) of the memory cells 26, the source (the right-side n-type diffusion layer 16 in FIG. 1) of the selection transistor 25 and a forward diode 28 are connected with one another via the first-layer metal interconnect 24. The forward diode 28 is a diode formed of the p-type diffusion layer 19 and the n-well 13 in FIG. 1.

The potential of the n-well 13 is connected with the drain of an antenna NMOS 42 whose source is connected with the ground potential of the semiconductor substrate.

Figure 4:
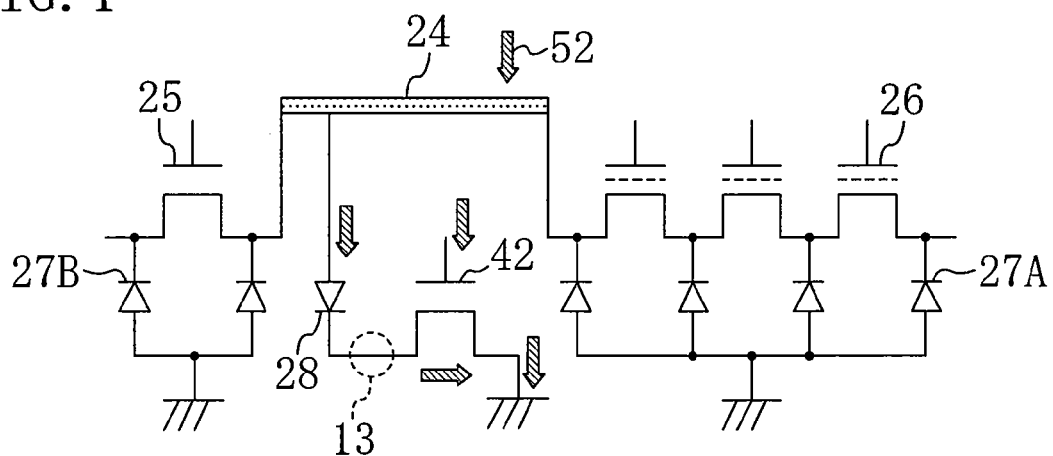
FIG. 4 is a circuit diagram showing a positive charge suppression method for a bit line of the semiconductor memory device of the embodiment.

In-process charge protection operation for bit lines will be described with reference to the relevant drawings. First, how positive charge 52 escapes during a wiring process will be described. As shown in FIG. 4, the positive charge 52 applied to the first-layer metal interconnect 24 escapes to the n-well 13 via the forward diode 28. Since the n-well 13 is connected with the drain of the antenna NMOS 42, the positive charge 52 that has escaped into the n-well 13 further escapes to the ground potential of the semiconductor substrate via the channel and source of the antenna NMOS 42. Note that the gate electrode of the antenna NMOS 42 is designed to have an antenna structure for collecting the positive charge 52 with a metal interconnect and the like to secure a sufficient ON state. The threshold voltage of the antenna NMOS 42 is set at about 0.6 V and hence the positive charge 52 is suppressed to about 1 V.

Figure 5:
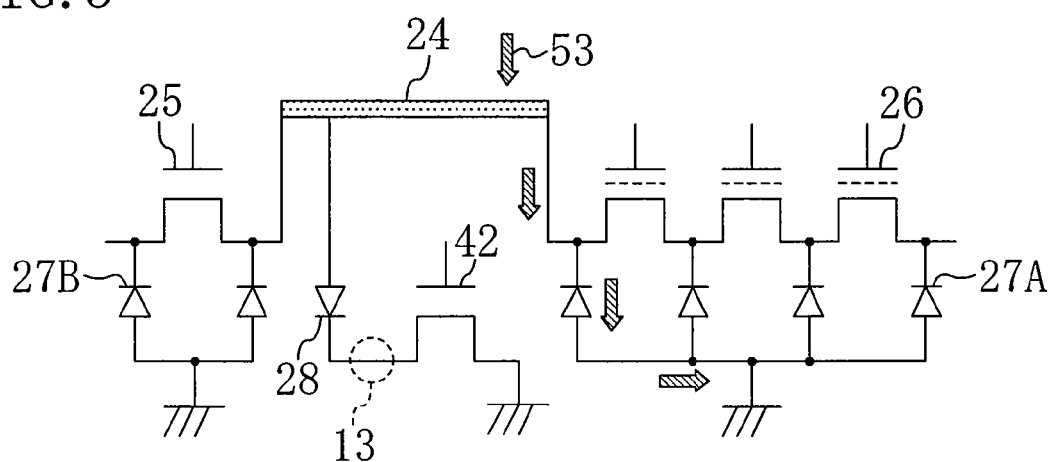
FIG. 5 is a circuit diagram showing a negative charge suppression method for a bit line of the semiconductor memory device of the embodiment.

How negative charge 53 escapes during a wiring process will then be described. As shown in FIG. 5, the negative charge 53 applied to the first-layer metal interconnect 24 charges the sources/drains of the memory cells 26 until reaching the breakdown voltage (about −0.6 V) of the backward diodes 27A of the memory cells 26. Once the negative charge 53 exceeds the breakdown voltage (about −0.6 V) of the backward diodes 27A, it escapes to the ground potential of the semiconductor substrate.

As described above, in-process charging to the bit line can be protected within the range of about +1 V to about −1 V.

Figure 6:
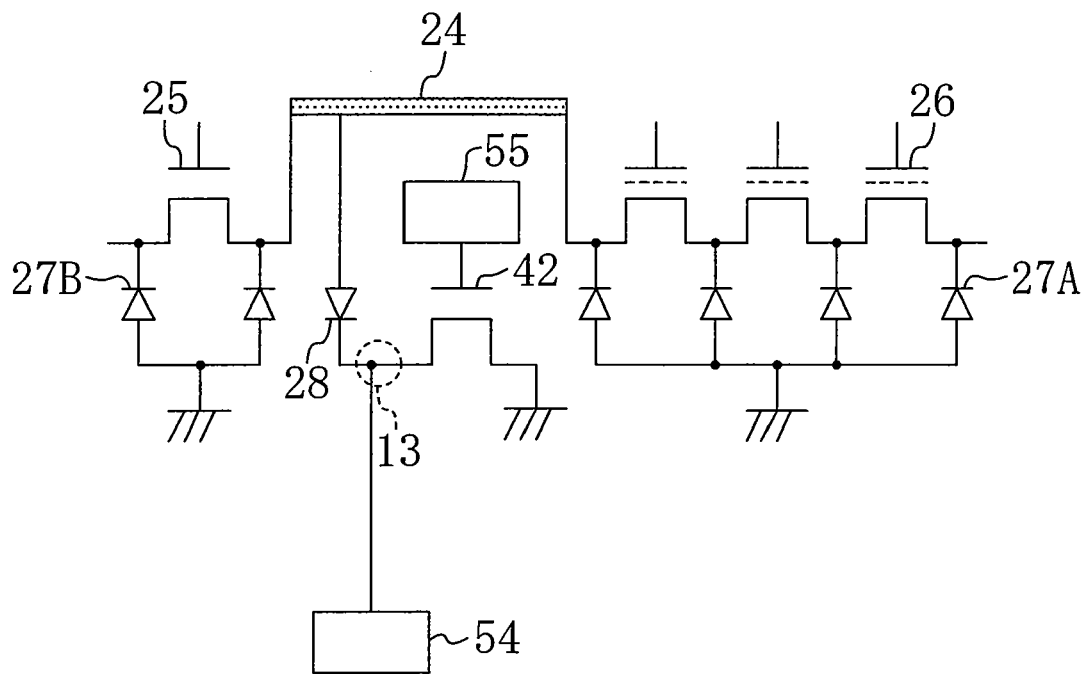
FIG. 6 is a circuit diagram showing the bit line protection circuit and additional circuits of the semiconductor memory device of the embodiment.

A control method for the semiconductor memory device of the embodiment under actual operation will be described with reference to FIG. 6. During actual operation such as write, erase and read, a voltage is applied to the sources/drains of the memory cells 26 via the selection transistor 25. More specifically, by applying a voltage to the gate of the selection transistor 25, a voltage applied to the drain of the selection transistor 25 is supplied to the sources/drains of the memory cells 26 via the channel and source of the selection transistor 25 and the first-layer metal interconnect 24.

During the above operation, the potential of the n-well 13 constituting the forward diode 28 is set at a voltage equal to or higher than the voltage supplied to the sources/drains of the memory cells 26 by means of a NW potential control circuit 54. No current therefore flows to the forward diode 28. Also, the gate voltage of the antenna NMOS 42 is fixed to the ground potential by means of a gate potential control circuit 55, so that the antenna NMOS 42 is OFF. The gate potential of the antenna NMOS 42 should preferably be put in a floating state during a major wiring process so as to function as an antenna. It is therefore recommended to connect the gate of the antenna NMOS 42 with the gate potential control circuit 55 via a metal interconnect in an upper layer as distant as possible.

Figure 7:
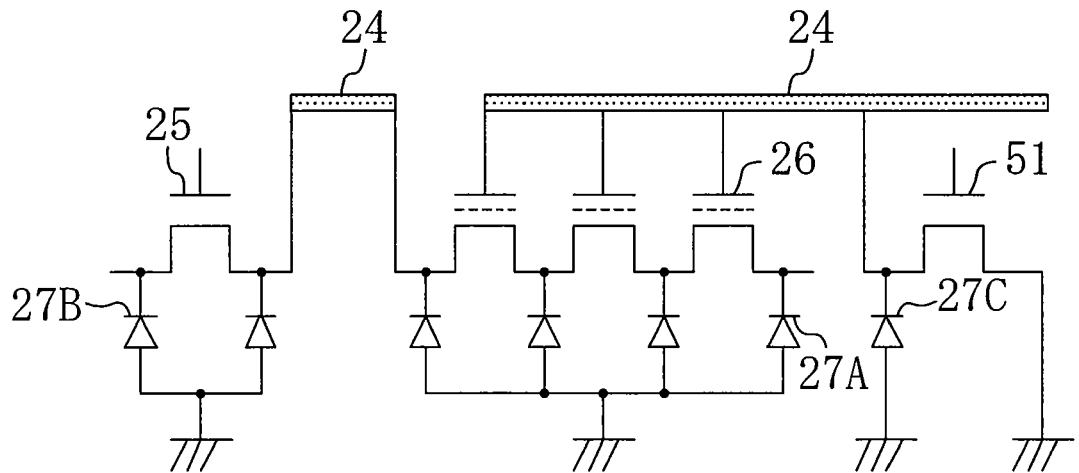
FIG. 7 is a circuit diagram showing a word line protection circuit of the semiconductor memory device of the embodiment.

Next, the protection circuit structure for word lines will be described with reference to FIG. 7. As shown in FIG. 7, the second gate electrode 22 of the memory cells 26 is connected with the first-layer metal interconnect 24, and the first-layer metal interconnect 24 is connected with the drain of an antenna NMOS 51 for word lines whose source is grounded.

Figure 8:
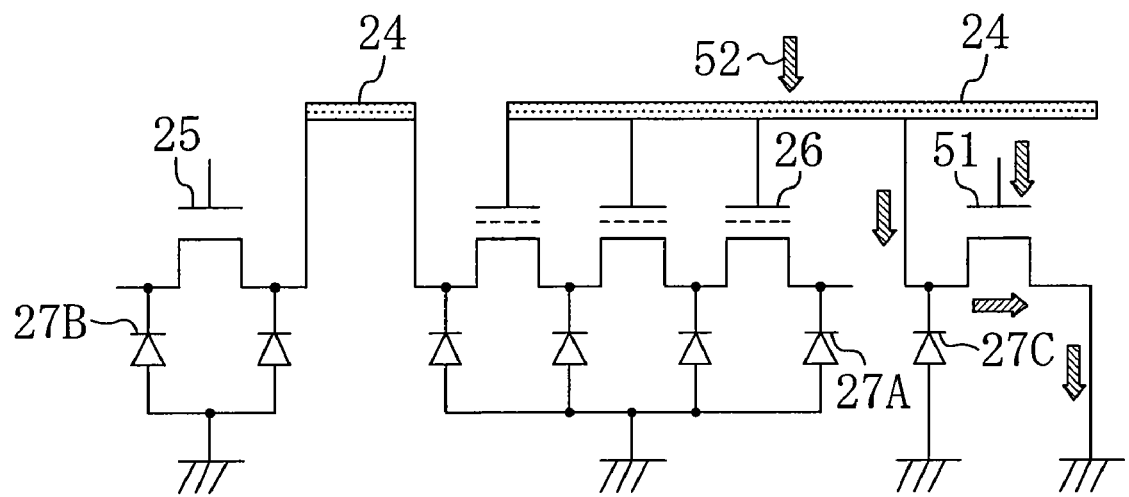
FIG. 8 is a circuit diagram showing a positive charge suppression method for a word line of the semiconductor memory device of the embodiment.

In-process charge protection operation for word lines will be described. First, how positive charge 52 escapes during a wiring process will be described. As shown in FIG. 8, the positive charge 52 applied to the first-layer metal interconnect 24 is then applied to the drain of the word-line antenna NMOS 51. At this time, the word-line antenna NMOS 51 is ON because the positive charge 52 is also applied to the gate of the word-line antenna NMOS 51. Hence, the positive charge 52 escapes to the ground potential of the semiconductor substrate 11 via the channel and source of the word-line antenna NMOS 51. The positive potential of the first-layer metal interconnect raised with the positive charge 52, which is determined with the threshold voltage of the word-line antenna NMOS 51, the antenna ratio and the like, is generally +1 V or less.

Figure 9:
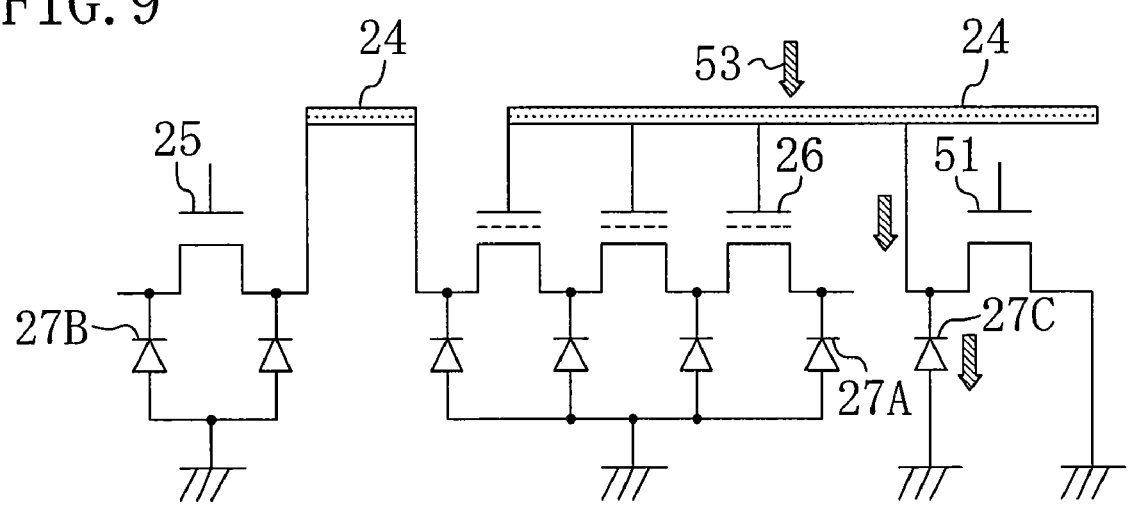
FIG. 9 is a circuit diagram showing a negative charge suppression method for a word line of the semiconductor memory device of the embodiment.

How negative charge 53 escapes during a wiring process will then be described. As shown in FIG. 9, the negative charge 53 applied to the first-layer metal interconnect 24 is then applied to the drain of the word-line antenna NMOS 51. The drain functions as a backward diode 27C. Hence, the sources/drains of the memory cells 26 and the drain of the word-line antenna NMOS 51 are charged until the charge reaches the breakdown voltage (about −0.6 V) of the backward diode 27C. Once the charge exceeds the breakdown voltage (about −0.6V) of the backward diode 27C, it escapes to the ground potential of the semiconductor substrate 11.

As described above, in-process charging to the word line is protected within the range of about ±1 V. Note that the protection circuit for word lines and the driving method for the same in the semiconductor memory device of the embodiment are substantially the same as those in the conventional semiconductor memory devices.

Figure 10:
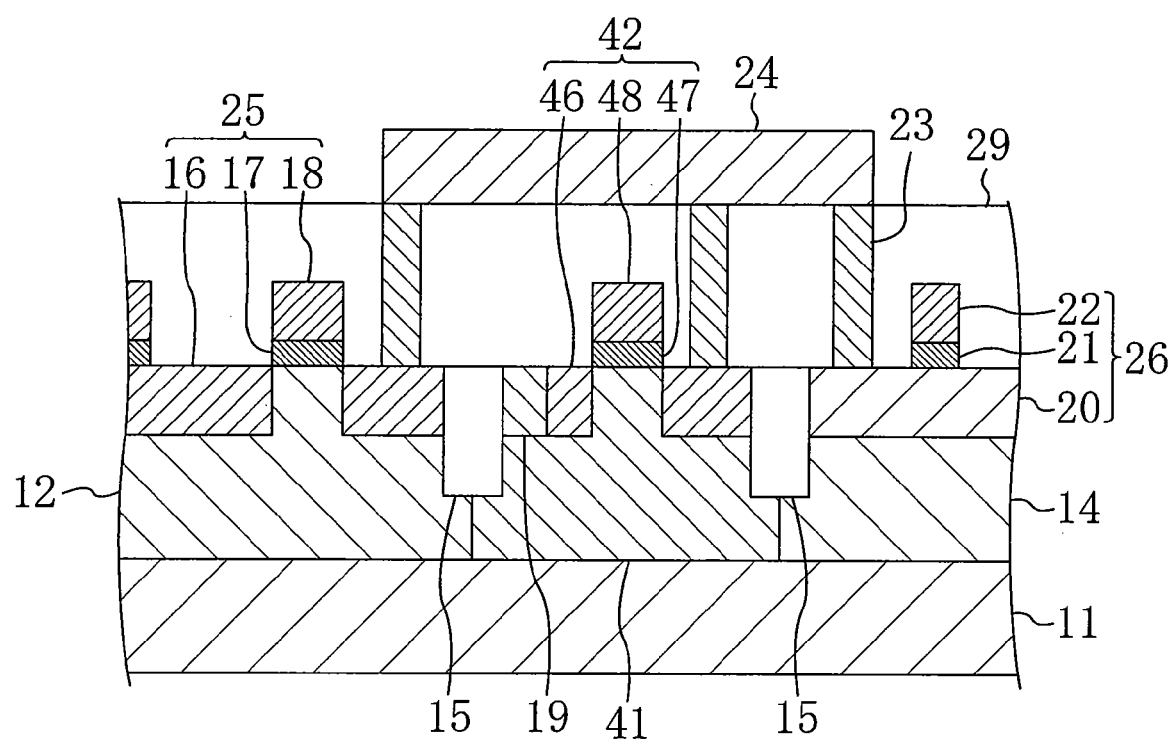
FIG. 10 is a cross-sectional view of an alteration of the semiconductor memory device of the embodiment.

The semiconductor device of the embodiment may be altered as follows. As shown in FIG. 10, first, second and third p-wells 12, 14 and 41 are formed in a semiconductor substrate 11. The first, second and third p-wells 12, 14 and 41 may have the same structure.

In the first p-well 12, a selection transistor 25 is formed which is electrically isolated from the surroundings with an element isolation film 15. The selection transistor 25 has n-type diffusion layers 16 as its source/drain, a first gate insulating film 17 and a first gate electrode 18.

In the second p-well 14, memory cells 26 are formed each of which has a bit line diffusion layer 20 as its source/drain, a second gate insulation film 21 and a second gate electrode 22.

In the third p-well 41, an antenna NMOS 42 is formed which is electrically isolated from the surroundings with the element isolation film 15. The antenna NMOS 42 has n-type diffusion layers 46 as its source/drain, a third gate insulating film 47 and a third gate electrode 48. One (source) of the n-type diffusion layers 46 is connected with a p-type diffusion layer 19, See, for example, FIG. 19.

An end of the bit line diffusion layer 20 of the memory cells 26, one of the n-type diffusion layers 16 of the selection transistor 25 and one (drain) of the n-type diffusion layers 46 of the antenna NMOS 42 that is not connected with the p-type diffusion layer 19 are electrically connected with one another via contacts 23 formed through an inter-layer insulating film 29 and a first-layer metal interconnect 24.

The third gate insulating film 47, the third gate electrode 48 and the n-type diffusion layers 46 that are to be the source/drain of the antenna NMOS 42 may be the same as the first gate insulating film 17, the first gate electrode 18 and the n-type diffusion layers 16 that are to be the source/drain of the selection transistor 25. The antenna NMOS 42 is not limited to this configuration but may have another configuration such as the configuration of the memory cells 26, for example.

The n-type diffusion layer 46 that is to be the source of the antenna NMOS 42 may be in direct contact with the p-type diffusion layer 19 as shown in FIG. 10, or may be connected therewith via a metal interconnect and the like.

Figure 11:
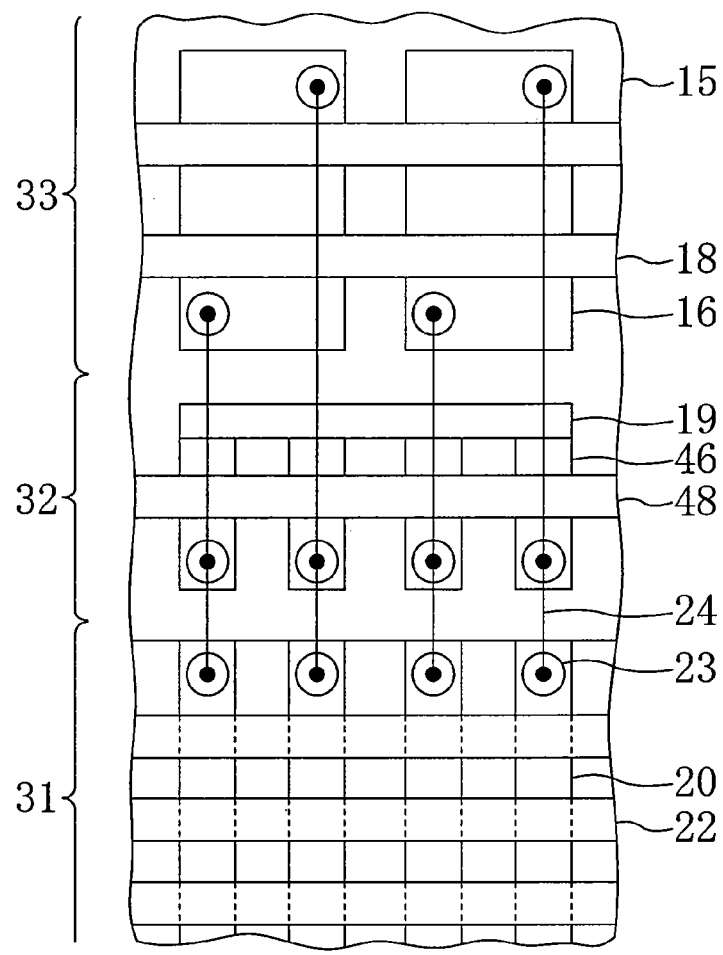
FIG. 11 is a plan view of the alteration of the semiconductor memory device of the embodiment.

The plane structure of the alteration of the semiconductor memory device of the embodiment will be described with reference to FIG. 11. As shown in FIG. 11, in a first region 31, in which the second p-well is formed, the second gate electrodes 22 that are to be word lines extending in the X direction and the bit line diffusion layers 20 that are to be bit lines extending in the Y direction are placed in a matrix, to thereby form a plurality of memory cells.

In a second region 32, in which the third p-well is formed, the n-type diffusion layers 46 surrounded with the element isolation film 15 and the third gate electrode 48 that is to be the gate electrode of the antenna NMOS extending in the X direction are formed, to thereby form a plurality of antenna NMOSs. Also, the p-type diffusion layer 19 is formed in contact with the n-type diffusion layers 46.

In a third region 33, in which the first p-well is formed, the n-type diffusion layers 16 isolated from one another with the element isolation film 15 and the first gate electrodes 18 extending in the X direction are formed, to thereby form a plurality of selection transistors separated pair by pair from one another.

An end of the bit line diffusion layer 20 of the memory cells 26, one of the n-type diffusion layers 16 of the selection transistor 25 and one of the n-type diffusion layers 46 of the antenna NMOS that is not connected with the p-type diffusion layer 19 are electrically connected with one another via contacts 23 and a first-layer metal interconnect 24.

Figure 12:
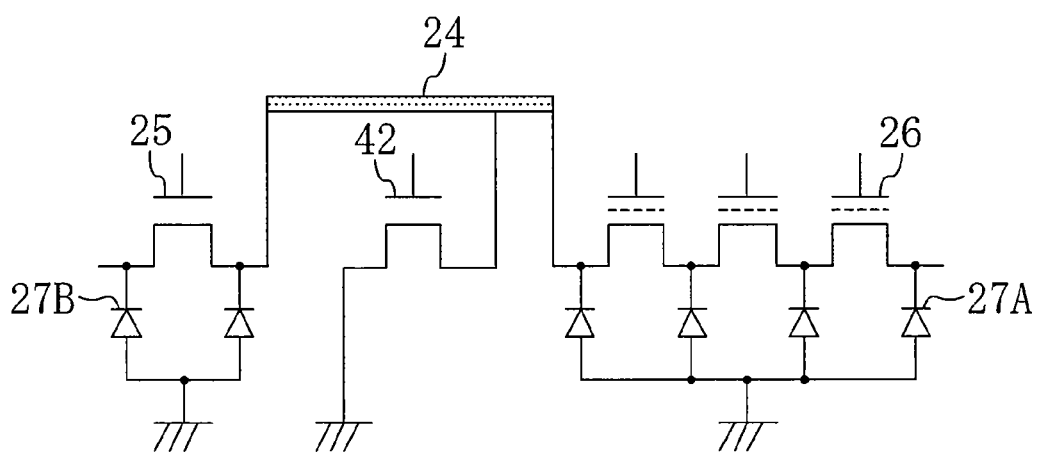
FIG. 12 is a circuit diagram showing a bit line protection circuit of the alteration of the semiconductor memory device of the embodiment.

The circuit structure of the semiconductor device of the alteration will be described. FIG. 12 shows an equivalent circuit of the semiconductor memory device shown in FIGS. 10 and 11. As shown in FIG. 12, backward diodes 27A are connected with the sources/drains of the memory cells 26. The backward diode 27A is a diode formed of the bit line diffusion layer 20 and the second p-well 14 in FIG. 10. Backward diodes 27B are connected with the source/drain of the selection transistor 25. The backward diode 27B is a diode formed of the n-type diffusion layer 16 and the first p-well 12 in FIG. 10. An end of the sources/drains (the bit line diffusion layer 20 in FIG. 10) of the memory cells 26, the source (the right-side n-type diffusion layer 16 in FIG. 10) of the selection transistor 25 and the drain (the right-side n-type diffusion layer 46 in FIG. 10) of the antenna NMOS 42 are connected with one another via the first-layer metal interconnect 24. The source (the left-side n-type diffusion layer 46 in FIG. 10) of the antenna NMOS 42 is grounded.

Figure 13:
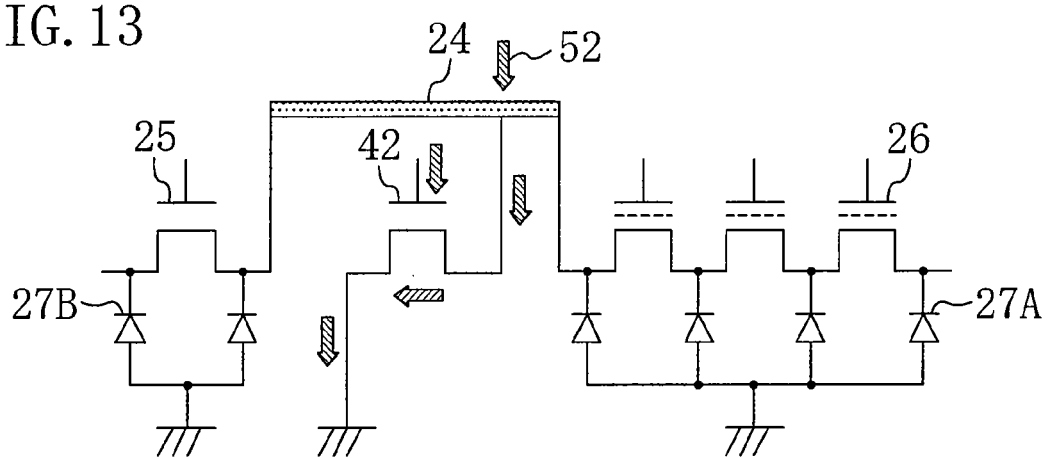
FIG. 13 is a circuit diagram showing a positive charge suppression method for a bit line of the alteration of the semiconductor memory device of the embodiment.

In-process charge protection operation for bit lines will be described with reference to the relevant drawings. First, how positive charge 52 escapes during a wiring process will be described. As shown in FIG. 13, the positive charge 52 applied to the first-layer metal interconnect 24 escapes to the ground potential of the semiconductor substrate from the drain of the antenna NMOS 42 via the channel and source thereof. Note that the gate electrode of the antenna NMOS 42 is designed to have an antenna structure for collecting the positive charge 52 with a metal interconnect and the like to ensure a sufficient ON state. The threshold voltage of the antenna NMOS 42 is set at about 0.6 V and hence the positive charge 52 is suppressed to about 1 V.

Figure 14:
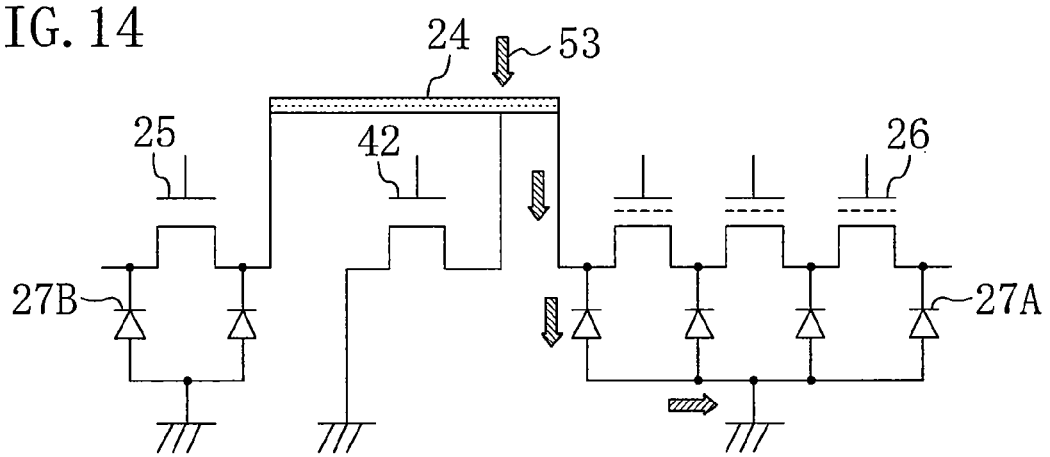
FIG. 14 is a circuit diagram showing a negative charge suppression method for a bit line of the alteration of the semiconductor memory device of the embodiment.

How negative charge 53 escapes during a wiring process will then be described. As shown in FIG. 14, the negative charge 53 applied to the first-layer metal interconnect 24 charges the sources/drains of the memory cells 26 until reaching the breakdown voltage (about −0.6 V) of the backward diodes 27A. Once the negative charge 53 exceeds the breakdown voltage (about −0.6 V) of the backward diodes 27A, it escapes to the ground potential of the semiconductor substrate.

As described above, in-process charging to the bit line can be protected within the range of about +1 V to about −1 V.

Figure 15:
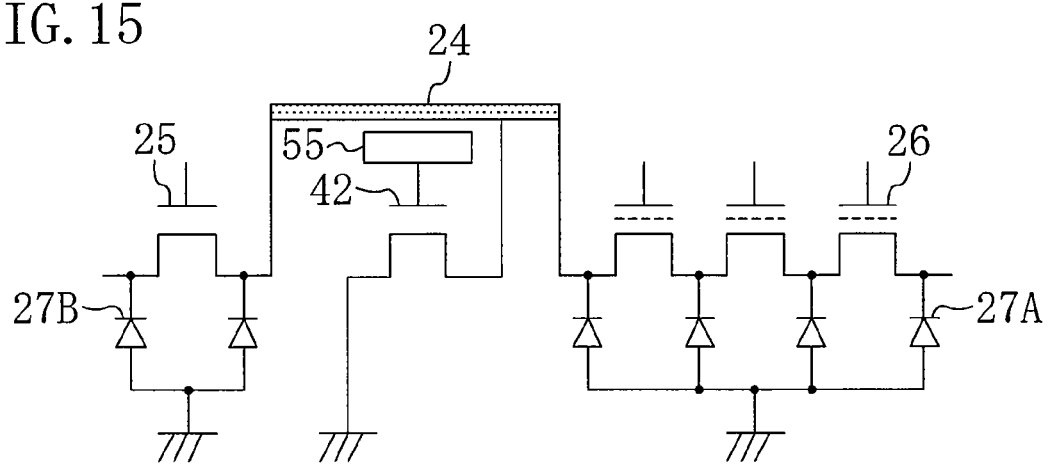
FIG. 15 is a circuit diagram showing the bit line protection circuit and an additional circuit of the alteration of the semiconductor memory device of the embodiment.

A control method for the alteration of the semiconductor memory device of the embodiment under actual operation will be described with reference to FIG. 15. During actual operation such as write, erase and read, a voltage is applied to the sources/drains of the memory cells 26 via the selection transistor 25. More specifically, by applying a voltage to the gate of the selection transistor 25, a voltage applied to the drain of the selection transistor 25 is supplied to the sources/drains of the memory cells 26 via the channel and source of the selection transistor 25 and the first-layer metal interconnect 24.

During the above operation, the gate voltage of the antenna NMOS 42 is fixed to the ground potential by means of a gate potential control circuit 55, so that the antenna NMOS 42 is OFF. The antenna NMOS 42 should preferably be put in a floating state during a major wiring process so as to function as an antenna. It is therefore recommended to connect the gate of the antenna NMOS 42 with the gate potential control circuit 55 via a metal interconnect in an upper layer as distant therefrom as possible.

Figure 16:
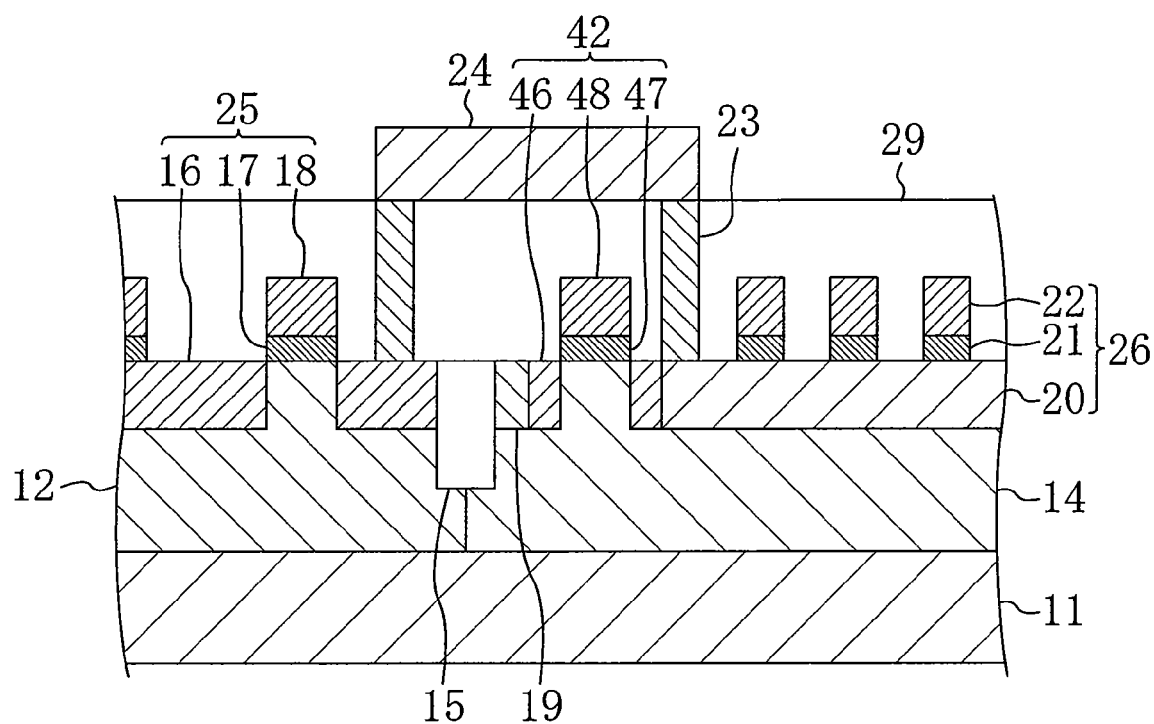
FIG. 16 is a cross-sectional view of a second alteration of the semiconductor memory device of the embodiment.

The semiconductor device of the embodiment may further be altered as follows. FIG. 16 shows a cross-sectional structure of a second alteration of the semiconductor memory device of the embodiment. In the semiconductor memory device of the second alteration, the antenna NMOS 42 is formed in the second p-well 14, and the n-type diffusion layer 46 that is to be the drain of the antenna NMOS 42 is directly connected with the bit line diffusion layer 20, not via the first-layer metal interconnect 24.

The antenna NMOS 42 may be the same as the selection transistor 25 in the configuration of the gate insulating film, the gate electrode, the source/drain diffusion layers and the like. The configuration is however not limited to this, but may be the same as that of the memory cells 26, for example.

The n-type diffusion layer 46 that is to be the source of the antenna NMOS 42 may be in direct contact with the p-type diffusion layer 19 as shown in FIG. 16, or may be connected therewith via a metal interconnect and the like.

The n-type diffusion layer 46 that is to be the drain of the antenna NMOS 42 may just be electrically connected with the bit line diffusion layer 20 in terms of the diffusion layer. Hence, it may be part of the bit line diffusion layer 20 or may be given as a diffusion layer different from the bit line diffusion layer 20.

Figure 17:
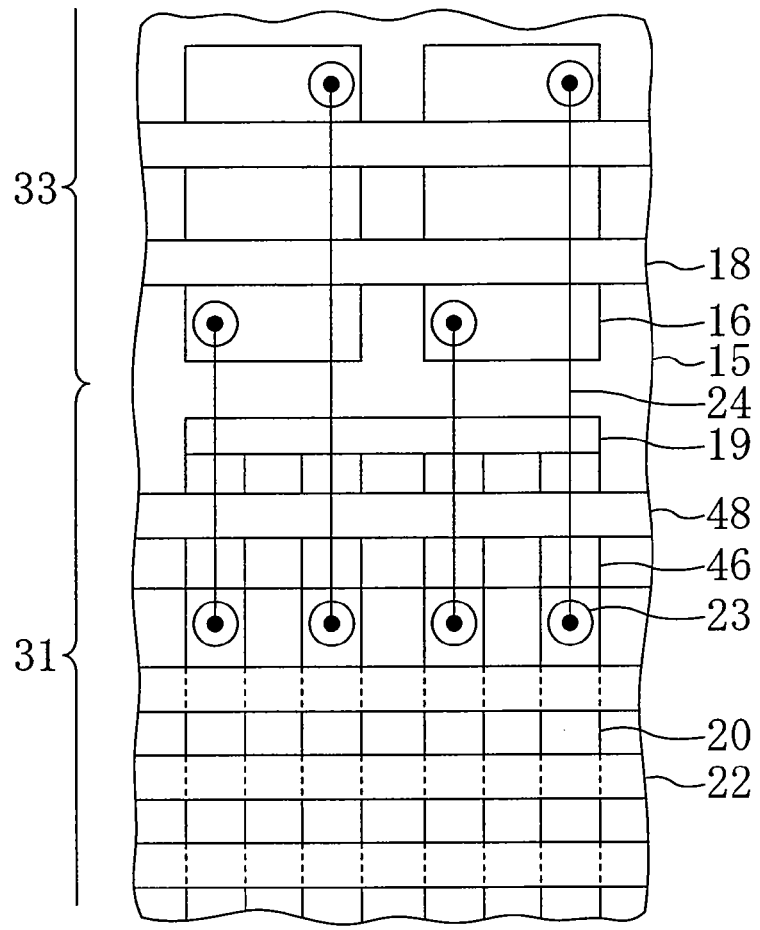
FIG. 17 is a plan view of the second alteration of the semiconductor memory device of the embodiment.

FIG. 17 shows a plane structure of the semiconductor memory device of the second alteration. As shown in FIG. 17, the n-type diffusion layer 46 that is to be the drain of the antenna NMOS 42 is directly connected with the bit line diffusion layer 20.

Figure 18:
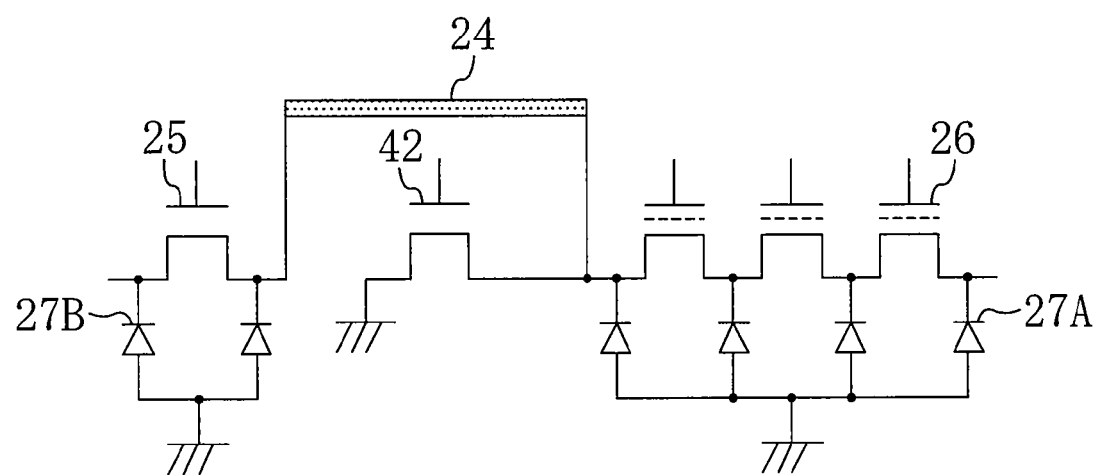
FIG. 18 is a circuit diagram showing a bit line protection circuit of the second alteration of the semiconductor memory device of the embodiment.

The circuit structure of the semiconductor device of the second alteration will be described. FIG. 18 shows an equivalent circuit of the semiconductor memory device shown in FIGS. 16 and 17. As shown in FIG. 18, the n-type diffusion layer 46 that is to be the drain of the antenna NMOS 42 is directly connected with the bit line diffusion layer 20, not via the first-layer metal interconnect 24 and the like.

Hence, in the second alteration, the positive charge 52 is allowed to escape to the ground potential of the semiconductor substrate once exceeding about 1 V without the necessity of formation of the first-layer metal interconnect 24.

As described above, the semiconductor memory device of the embodiment and the alterations thereof, as well as the driving methods for such semiconductor memory devices, in which positive/negative charge applied to bit lines of memory cells during a fabrication process can be suppressed within about ±1 V, are especially useful as MONOS memories and driving methods for such memories.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. Therefore, it is intended that the following claims cover all such modifications and changes as fall within the true spirit and scope of the invention.

What is claimed is:

1. A semiconductor memory device comprising:
a first well of a first conductivity type, a second well of the first conductivity type and a third well of a second conductivity type formed in a substrate:
a diffusion bit line extending in a row direction and a word line extending in a column direction both formed in the second well;
a plurality of semiconductor memory elements arranged in a matrix, each connected with the diffusion bit line and the word line;
a first transistor formed in the first well for applying a voltage to the diffusion bit line; and a diode formed in the third well, the diode being formed of the third well and a diffusion layer of the first conductivity type formed in an upper portion of the third well,
wherein the diffusion bit line, the diode and a source of the first transistor are electrically connected with one another.

2. The device of claim 1, further comprising:
a fourth well of the first conductivity type formed in the substrate; and
a second transistor formed in the fourth well, the second transistor having a source connected with a ground potential and a drain electrically connected with the third well.

3. The device of claim 1, further comprising:
a plurality of layers of metal interconnects formed above the substrate,
wherein the diffusion bit line and the diode are electrically connected with each other via a first-layer metal interconnect among the plurality of metal interconnects that is located closest to the substrate.

4. The device of claim 1, wherein the third well is connected with a potential control circuit for controlling the potential of the third well.

5. The device of claim 1, wherein each of the semiconductor memory elements has a gate insulating film including a charge trap film formed on the substrate and a gate electrode formed on the gate insulating film.

6. A semiconductor memory device comprising:
a first well of a first conductivity type, a second well of the first conductivity type and a third well of the first conductivity type formed in a substrate:
a diffusion bit line extending in a row direction and a word line extending in a column direction both formed in the second well;
a plurality of semiconductor memory elements arranged in a matrix, each connected with the diffusion bit line and the word line;
a first transistor formed in the first well for applying a voltage to the diffusion bit line; and
a second transistor formed in the third well,
wherein the diffusion bit line, a drain of the second transistor and a source of the first transistor are electrically connected with one another, and
a source of the second transistor is connected with a ground potential.

7. The device of claim 6, further comprising:
a plurality of layers of metal interconnects formed above the substrate,
wherein the diffusion bit line and the drain of the second transistor are electrically connected with each other via a first-layer metal interconnect among the plurality of metal interconnects that is located closest to the substrate.

8. The device of claim 6, wherein the diffusion bit line and the drain of the second transistor are in contact with each other.

9. The device of claim 6, wherein a gate electrode of the second transistor is connected with a gate potential control circuit for controlling the gate potential of the second transistor.

10. The device of claim 6, wherein each of the semiconductor memory elements has a gate insulating film including a charge trap film formed on the substrate and a gate electrode formed on the gate insulating film.

11. A driving method for a semiconductor memory device comprising: a first well of a first conductivity type, a second well of the first conductivity type, a third well of a second conductivity type and a fourth well of the first conductivity type formed in a substrate: a diffusion bit line extending in a row direction and a word line extending in a column direction both formed in the second well; a plurality of semiconductor memory elements arranged in a matrix, each connected with the diffusion bit line and the word line; a first transistor formed in the first well for applying a voltage to the diffusion bit line; a diode formed in the third well, the diode being formed of the third well and a diffusion layer of the first conductivity type formed in an upper portion of the third well; a second transistor formed in the fourth well with a source grounded; and a potential control circuit for controlling the potential of the third well, wherein the diffusion bit line, the diode and a source of the first transistor are electrically connected with one another, a drain of the second transistor is electrically connected with the third well, and the source of the second transistor is connected with a ground potential, the method comprising:
during actual operation of applying a bit line drive voltage to the diffusion bit line, applying a voltage equal to or higher than the bit line drive voltage to the third well with the potential control circuit while fixing a gate voltage of the second transistor to the ground potential to put the second transistor in an OFF state.

12. A driving method for a semiconductor memory device comprising: a first well of a first conductivity type, a second well of the first conductivity type and a third well of the first conductivity type formed in a substrate: a diffusion bit line extending in a row direction and a word line extending in a column direction both formed in the second well; a plurality of semiconductor memory elements arranged in a matrix, each connected with the diffusion bit line and the word line; a first transistor formed in the first well for applying a voltage to the diffusion bit line; and a second transistor formed in the third well, wherein the diffusion bit line, a drain of the second transistor and a source of the first transistor are electrically connected with one another, and a source of the second transistor is connected with a ground potential, the method comprising:
during actual operation of applying a bit line drive voltage to the diffusion bit line, fixing a gate voltage of the second transistor to the ground potential to put the second transistor in an OFF state.

* * * * *